United States Patent [19]
Tauchmann et al.

[11] Patent Number: 5,911,355
[45] Date of Patent: Jun. 15, 1999

[54] METHOD AND DEVICE FOR MECHANICALLY REMOVING SOLDER BEADS ON THE SURFACE OF THE PRINTED CIRCUIT BOARDS

[75] Inventors: Jens Tauchmann, Berlin; Tilman Schwinn; Heinz-Olaf Lucht, both of Krefeld, all of Germany

[73] Assignee: Messer Greishiem, Germany

[21] Appl. No.: 08/900,804

[22] Filed: Jul. 25, 1997

[30] Foreign Application Priority Data

Aug. 10, 1996 [DE] Germany ............... 196 32 335

[51] Int. Cl.$^6$ ..................... B23K 31/00
[52] U.S. Cl. ............. 228/125; 228/264; 228/20.1; 228/20.5; 228/19; 228/199; 228/200; 228/201
[58] Field of Search ............ 228/264, 20.1, 228/20.5, 19, 199, 200, 201; 427/348, 349; 118/63

[56] References Cited

U.S. PATENT DOCUMENTS

| | | | |
|---|---|---|---|
| 3,680,199 | 8/1972 | Johnson | 228/196 |
| 4,419,566 | 12/1983 | Fortune | 219/230 |
| 4,995,411 | 2/1991 | Lowell et al. | 134/198 |
| 5,205,461 | 4/1993 | Bickford et al. | 228/220 |
| 5,419,481 | 5/1995 | Lasto et al. | 228/6.2 |
| 5,579,979 | 12/1996 | Kurpiela | 228/6.2 |

FOREIGN PATENT DOCUMENTS

| | | |
|---|---|---|
| 38 43 191 | 3/1990 | European Pat. Off. . |
| 44 16 788 | 11/1995 | European Pat. Off. . |
| 0 761 361 | 3/1997 | European Pat. Off. . |

OTHER PUBLICATIONS

Database WPI; Week 9738; Derwent Publications Ltd., London, GB; AN 97–408897; XP002045688 & HP 09 181 436 A (Mitsumoto T et al.) Jul. 11, 1997.

Patent Absracts of Japan; vol. 18, No. 202 (E–1535), Apr. 8, 1994 & JP 06 006025 A (Fujitsu Ltd), Jan. 14, 1994.

Patent Abstracts of Japan; vol. 18, No. 314 (M–1621), Jun. 15, 1994 & JP 06 071467 A (Fujitsu Ltd) Mar. 15, 1994.

*Primary Examiner*—Patrick Ryan
*Assistant Examiner*—Kiley Stoner
*Attorney, Agent, or Firm*—Connolly & Hutz

[57] ABSTRACT

The invention relates to a method for mechanically removing solder beads (14) from the surface of printed circuit boards (10) directly after they pass through the solder flow during flow soldering of printed circuit boards in a soldering plant. In order to ensure that the solder beads are mechanically removed without damaging the printed circuit boards, the solder beads (14) are mechanically removed by means of at least one jet (50) of cold gas directed onto the surface.

11 Claims, 2 Drawing Sheets

METHOD AND DEVICE FOR MECHANICALLY REMOVING SOLDER BEADS ON THE SURFACE OF THE PRINTED CIRCUIT BOARDS

BACKGROUND OF THE INVENTION

The invention relates to a method and a device for mechanically removing solder beads on the surface of printed circuit boards, and to a cold-gas mixer for providing a stream of cold gas for the mechanical removal of solder beads on the surface of printed circuit boards.

When printed circuit boards are flow soldered, so-called solder beads are produced owing to various physical effects. These solder beads can lead to serious functional faults in electronic equipment. In the past, such solder beads were removed by means of a washing process using hydrofluorocarbons (HFCs). Owing to the fact that, for environmental reasons, the use of HFC.s is no longer possible without massive restrictions, methods are used which are not harmful to the environment.

Attempts are therefore being made to prevent the formation of solder beads from the outset by using modified solder resists with repellant properties. Because the solder resist must at the same time adhere to the printed circuit boards, however, the adhesion of solder cannot be completely prevented in this way.

Therefore, in DE-A 44 16 788 it has already been proposed to prevent the adhesion of solder beads on the surface of printed circuit boards by means of an additional artificial cooling with a stream of gas. The intention here is to generate a thermomechanical mismatch between the solder mask and the solder by means of a stream of gas which is at most at room temperature, so that solder beads cannot adhere at all.

In addition to these measures for avoiding the adhesion of solder beads on the surface of printed circuit boards, brush devices are known which can be used to remove the solder beads mechanically. However, it is not possible with this measure to rule out damage to surface mounted devices on the surface of the printed circuit board and to components with connecting wires, or to the printed circuit board in its entirety.

SUMMARY OF THE INVENTION

The invention is based on the object of providing a method and a device for mechanically removing solder beads on the surface of printed circuit boards, with which adhering solder beads can be removed without damaging the printed circuit boards.

In the method according to the invention, the mechanical removal of the solder beads is carried out during the destruction of the adhesion surfaces formed between the solder resist and the solder; in this process, the cooling of the surface of the printed circuit boards and the mechanical removal of the solder beads by means of a cold jet of gas occur simultaneously. By forming a cold jet of gas, a high blowing pressure is formed on the surface of the printed circuit board and this removes the solder beads from the surface of the printed circuit boards.

Particularly good mechanical removal of the solder beads can be achieved with the method according to the invention if the jet of gas is applied to the surface of the printed circuit boards at a temperature of between $-20°$ C. and $-60°$ C. and at a blowing angle <45°, preferably at a blowing angle of between 30° and 40°, measured between the printed circuit board and the outlet orifice of the nozzle. The adjustment parameters and temperature parameters ensure almost complete removal of the solder beads.

Particularly good working results can be achieved if the jet of gas is applied to the solder beads after they have solidified. Solidification here is understood to mean cooling of the solder beads to a consistency which is no longer fluid. Mechanically removing the solder beads after solidification avoids spraying caused by the jet of cold gas impinging at a high blowing pressure.

Preferably, a large number of jets of cold gas are applied to at least one side of the surface of the printed circuit board over the entire width, each of said jets being produced by splitting it off from one stream of cold gas. In this context, an appropriate number of jets of gas are applied to the surface of the printed circuit boards over the entire width, preferably in the feed direction of the printed circuit boards. As a result of the jets of gas emerging from nozzles in the conveying direction of the printed circuit boards it is possible to dispense with moving the jets. Of course it is also possible to arrange the jets laterally with respect to the conveying path of the printed circuit boards and to move the jets perpendicularly with respect to the conveying path of the printed circuit boards. By arranging a plurality of rows of nozzles, arranged one behind the other, in the conveying direction of the printed circuit boards it is possible to form curtain-like rows of jets of gas over the entire width of one side of the surface of the printed circuit boards, which rows of jets can be switched on and off depending on the coldness requirements for the thermomechanical mismatch and the mechanical removal of the solder beads.

It is particularly advantageous if the stream of cold gas produced to form the jets of gas is formed from an inert gas, as a result of which the oxidation of the soldered points is impeded and the surface tension of the solder is increased. The inert gases used are nitrogen, argon, carbon dioxide or gas mixtures thereof. The temperature of the stream of cold gas is established by the gaseous phase and the liquid phase of the gas or gas mixture used. The mixing of the supercooled liquid gas and the gaseous gas or gas mixture is carried out such that, prior to mixing, the mass of the liquid is lower than that of the gas. The formation, according to the invention, of a stream of cold gas by mixing the gaseous phase and the liquid phases of the gas or gas mixture used advantageously makes it possible, with little outlay, to apply a jet of gas which is cooled to temperatures between $-20°$ C. and $-60°$ C. to a limited area of the surface of the printed circuit boards.

The shaping of the stream of gas into jets of gas in Laval channels of the nozzles enables high exit speeds from the nozzles to be achieved, by means of which a high blowing pressure can be obtained on the surface of the printed circuit boards at a low gas throughput rate.

Particularly good economic results can be achieved with the method according to the invention if the stream of cold gas is produced discontinuously as a function of a signal which is formed in the soldering plant as the printed circuit boards pass through. The signal can be produced here for example when the printed circuit boards enter the soldering plant; however, it can also be formed at a different location in the soldering plant and can be used to start the jets of gas. In order to obtain the preferred temperature range between $-20°$ C. and $-60°$ C., preferably $-25°$ C. to $-45°$ C., at the surface of the printed circuit boards, the temperature of the stream of cold gas is set as a function of the initial travel of the printed circuit board until it reaches the jets of gas and/or the actual temperature of the stream of gas. Here, the cooling is carried out in a plurality of phases with different temperature values. The device for mechanically removing solder beads is operated cold according to one control cycle, and according to another control cycle the temperature of the printed circuit board and of the stream of gas is taken into account when the gas jets are applied.

A device according to the invention can be used to produce jets of cold gas in an easy way and to direct them onto the surface of the printed circuit boards. By constructing the nozzle as a Laval nozzle, high blowing pressures for the mechanical removal of the solder beads can be produced.

By means of the features of the invention it is possible to produce, with little outlay, a stream of cold gas whose temperature can be easily matched to the soldering conditions and the soldering plants.

BRIEF DESCRIPTION OF THE DRAWINGS

An exemplary embodiment of the invention is illustrated in the drawing and will be described in more detail below. In this drawing:

FIG. 3 shows a schematic, sectional illustration of the cold-gas mixer illustrated in FIG. 2.

DETAILED DESCRIPTION

Figure 1:
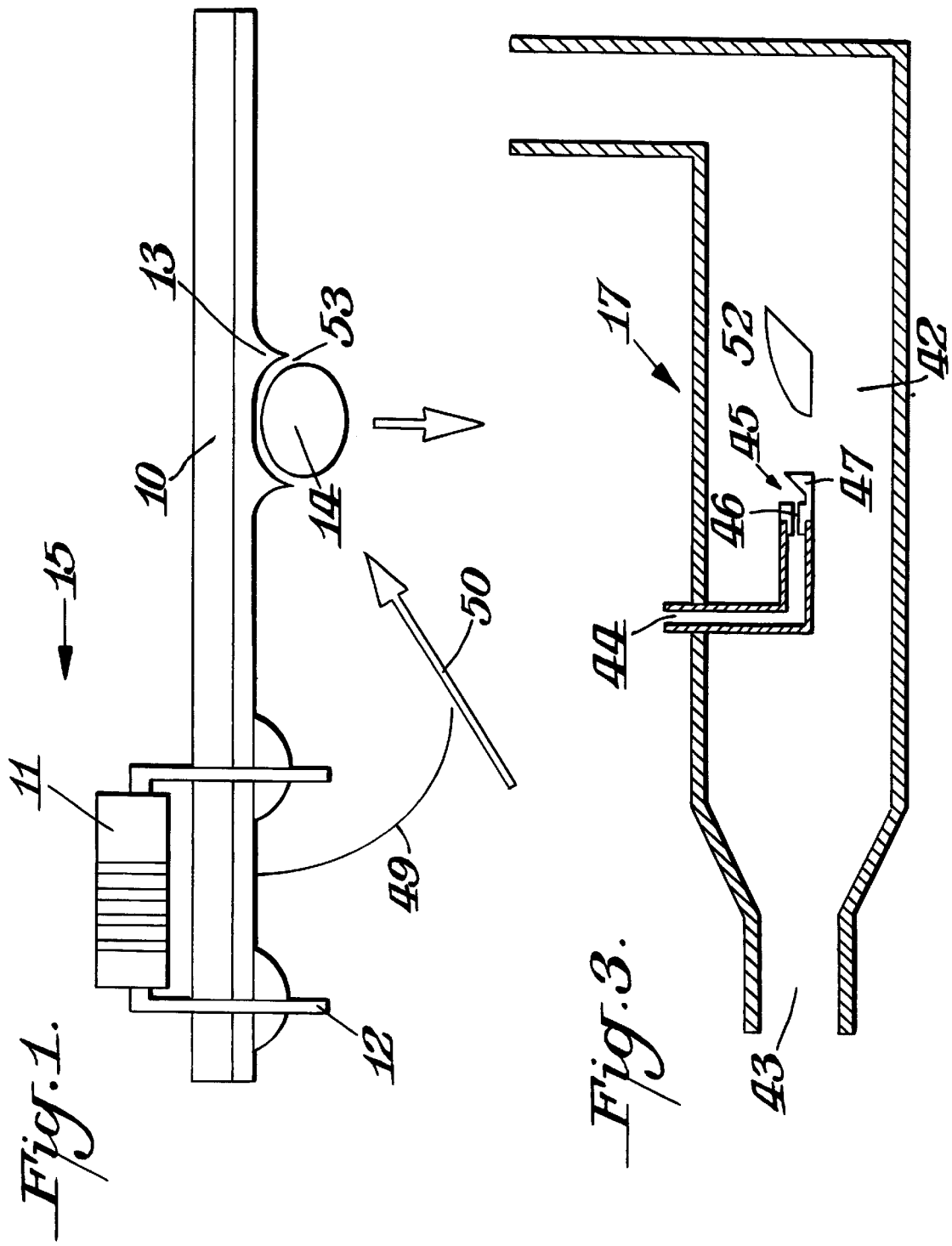
FIG. 1 shows a schematic side view of a detail of a printed circuit board.

FIG. 1 is a schematic illustration of a printed circuit board 10 with components 11 with connecting wires 12, which wires 12 are processed in a soldering plant (not illustrated in more detail) according to a flow soldering method described in DE-A 44 16 788. The printed circuit boards 10 which are arranged on a transport frame are conveyed by a transporting device in the direction of transport 15 to a wetting device in which flux is applied to the lower soldering surface of the printed circuit board 10.

Figure 2:
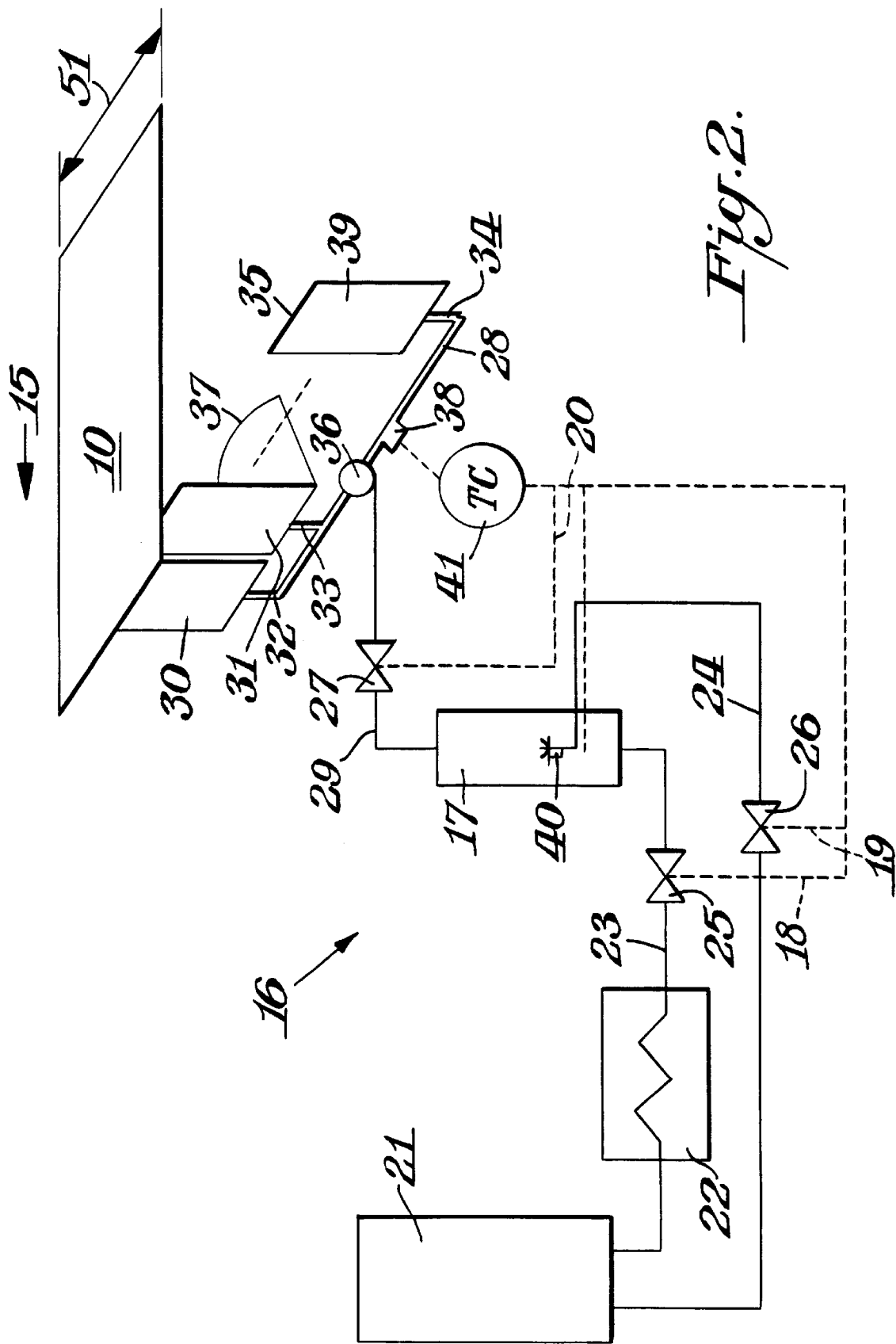
FIG. 2 shows a schematic illustration of the device for producing jets of cold gas.

After the transport frame with the printed circuit board 10 to be soldered has moved away over the wetting device, it passes into the region of a flow soldering device. Here, the transport device is aligned with respect to the solder flow in such a way that the printed circuit board 10 to be soldered passes through the solder flow, causing soldering takes place. During the soldering, the flow behavior of the solder flow is impeded by the components and the connecting wires 12. This leads to the solder separating and forming a tin/lead mixed oxide surface in the soldering atmosphere. These oxidized solder volumes are adhesively fixed on the solder resist 13 of the printed circuit boards 10 as solder beads 14. In the transport direction 15 of the printed circuit board 10, a cold-gas jet device 16 is provided downstream of the soldering device for mechanically removing the solder beads 14. The cold-gas jet device 16 illustrated only schematically in FIGS. 2 and 3 comprises essentially a cold-gas mixer 17 which is connected on the inlet side via two lines 23, 24 to a cold-insulated vessel 21 for supercooled liquefied gases or gas mixtures. Arranged in the line 23 is an air evaporator 22 in which the supercooled liquefied gas conveyed from the vessel 21 to the cold-gas mixer 17 is evaporated. An adjustment means 25, 26, for example metering valves, which can be actuated by means of control lines 18, 19, is arranged between the air evaporator 22 and the cold-gas mixer in the line 23 and in the line 24. The gases present in line 23 downstream of the air evaporator and the amounts of liquefied gas conveyed from the vessel 21 in line 24 can be controlled or regulated by means of the metering valves. In this process, differing amounts of gas and liquefied gas can be fed to the cold-gas mixer 17. By adjusting the mixing ratio of gas to liquefied gas, a stream of gas of any desired coldness can be produced in the cold-gas mixer 17.

Of course, the amounts of gas and liquefied gas can also be adjusted by means of bypass lines which can be switched on or off and which have different throughput volumes and so on.

On the output side, the cold-gas mixer 17 is connected to distributor elements 28 via an adjustment means 27, for example a solenoid valve, which is arranged in line 29 and can be actuated by means of control line 20. The distributor element 28, for example a distributor pipe, extends over the entire width 51 of the printed circuit board 10 and is constructed as a carrier for the nozzles 30, 31, 39 which are each supplied with the cold-gas stream produced in the cold-gas mixer, via branching lines 32, 33, 34. The nozzles 30, 31, 39 are constructed as Laval nozzles and have Laval channels 35 for reshaping the stream of cold gas into a jet of cold gas. The distributor element 28 has means 36 for adjusting the angular position 37 between the printed circuit board 10 and the nozzles 30, 31, 39. The means 36, for example a hinge, can of course also be assigned to the nozzles 30, 31, 39. With this design, the angular position 37 of each nozzle 30, 31, 39 can be set individually. A plurality of these distributor elements 28 can be arranged parallel to one another in the transport direction. Temperature sensors 38, 40 are assigned to the distributor element and/or the cold-gas mixer 17 and can be used to determine the actual temperature and can be made available to a controller as control signal. With the controller 41 which can be memory-programmable for example, the adjustment means 25, 26, 27 are switched in accordance with the operating state of the soldering plant in such a way that a discontinuous mode of operation is possible. This is an advantageous way of minimizing the gas consumption because of the often very irregular throughput of printed circuit boards 10. The discontinuous control is produced as a function of a signal which is formed in the soldering plant as the printed circuit boards 10 pass through. The signal is advantageously formed in the soldering plant as the printed circuit boards 10 enter, so that the temperature, set in the cold-gas mixer, of the stream of cold gas is set as a function of the initial travel of the printed circuit board 10 until it reaches the jets of gas emerging from the nozzles 30, 31, 39 and the actual temperature of the stream of gas determined with the sensors 38, 40. The cold-gas jet device 16 is operated with two control variants with different set-point temperature values. In the first mode of operation, the cold-gas jet device 16 is operated cold from the warm state at about 20° C. into the actual operating state. At a temperature >–20° C. to –30° C., the device 16 is operated cold with a cold stream of gas until a temperature between –60° C. and –70° C. is detected by means of the sensors 40 and/or 38. Then, a stream of gas with a temperature between –20° C. and –60° C., preferably between –25° C. to –30° C. and –35° C. to –40° C. is set in order to form the jets of gas emerging from the nozzles 30, 31, 39.

The cold-gas mixer 17 is illustrated schematically in section in FIG. 3. The cold-gas mixer 17 comprises essentially a mixing chamber 42 which is connected via gas inlet 43 to line 23 and via liquefied gas conduit 44 to line 24. The liquefied gas conduit 44 has an outlet nozzle 45 with a round outlet passage 46, upstream of which an atomizing element 47 is arranged. The atomizing element 47 is constructed as a deflector and is arranged at a distance in front of the outlet passage 46. The deflector 47 extends at an angle of incidence 52 >90° with respect to the outlet passage 46. In the mixing chamber 42, supercooled liquefied gas, via liquefied gas conduit 44, and gas, via gas inlet 43, are mixed in such a way that upstream of the cold-gas outlet 48 the mass of fluid is less than that of the gas. To this end, the liquefied gas passes through the round outlet passage 46 to the atomizing element 47, by which it is fed into the mixing gas chamber in an extremely fine spray and evaporated there. As a result, the gas fed via the gas inlet is cooled and conducted via the cold-gas outlet to the distributor element 28.

Trials have shown that a jet 50 of gas which is formed at a temperature between −20° C. and −60° C. in the Laval channels 35 from an inert gas or an inert gas mixture and which strikes the no longer liquid solder bead 14 at a blowing angle 49 of <45°, preferably at a blowing angle between 30° and 40°, produces a mismatch 53 between the solder resist 13 and solder bead 14 while simultaneously mechanically removing the solder beads 14. By means of the invention, the solder beads 14 are mechanically removed by the jets 50 of gas during the release contraction.

Inert gas can optionally be applied to the bottom of the printed circuit boards by means of a further flat-jet nozzle as they pass through the solder flow. In this way, the formation of small solder nodules can be reduced and the reliability of the method described above can be increased further.

What is claimed is:

1. In a method for mechanically removing solder beads on a surface of printed circuit boards directly after they pass through the solder flow during the flow soldering of printed circuit boards in a soldering plant, the improvement being in that the solder beads are mechanically removed by means of at least one jet of cold gas directed onto the surface.

2. The method as claimed in claim 1, wherein the jet of gas is applied to the surface at a temperature of between −20° C. and −60° C.

3. The method as claimed in claim 1, wherein the jet of gas is applied to the surface after the solder beads have solidified.

4. The method as claimed in claim 1, wherein the jet of gas is applied to the surface at a blowing angle which is less than 45°, preferably at a blowing angle of between 30° and 40°.

5. The method as claimed in claim 1, wherein a plurality of jets of cold gas are applied to at least one side of the surface over the entire width of the printed circuit board, jets of cold gas are produced by splitting it off from one stream of cold gas.

6. The method as claimed in claim 1, wherein the stream of cold gas is formed from an inert gas, selected from the group consisting of nitrogen, argon, carbon dioxide and gas mixtures thereof.

7. The method as claimed in claim 1, wherein the stream of cold gas is formed from the gaseous phase and the liquid phase of the gas or gas mixture used.

8. The method as claimed in claim 1, wherein the jets of cold gas are formed in nozzles and are directed against the surface with a high blowing pressure.

9. The method as claimed in claim 1, wherein the jets of gas are formed in Laval channels of the nozzles.

10. The method as claimed in claim 1, wherein the stream of cold gas is produced discontinuously as a function of the signal which is formed in a soldering plant as the printed circuit boards pass through.

11. The method as claimed in claim 1, wherein the temperature of the stream of cold gas is set as a function of the initial travel of the printed circuit board until it reaches the jets of gas and/or as a function of the actual temperature of the stream of gas.

* * * * *